United States Patent
Barfoot et al.

(10) Patent No.: US 10,704,377 B2
(45) Date of Patent: Jul. 7, 2020

(54) WELL MONITORING WITH OPTICAL ELECTROMAGNETIC SENSING SYSTEM

(71) Applicant: Halliburton Energy Services, Inc., Houston, TX (US)

(72) Inventors: David A. Barfoot, Houston, TX (US); Peter J. Boul, Houston, TX (US); Tasneem A. Mandviwala, Katy, TX (US); Leonardo de Oliveira Nunes, Rio de Janeiro (BR)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/511,215

(22) PCT Filed: Oct. 17, 2014

(86) PCT No.: PCT/US2014/061079
§ 371 (c)(1),
(2) Date: Mar. 14, 2017

(87) PCT Pub. No.: WO2016/060678
PCT Pub. Date: Apr. 21, 2016

(65) Prior Publication Data
US 2017/0254191 A1  Sep. 7, 2017

(51) Int. Cl.
*E21B 47/00* (2012.01)
*G01V 3/18* (2006.01)
(Continued)

(52) U.S. Cl.
CPC ........ *E21B 47/0005* (2013.01); *E21B 47/102* (2013.01); *E21B 47/122* (2013.01);
(Continued)

(58) Field of Classification Search
CPC .............. E21B 47/0005; E21B 47/122; E21B 47/0042; E21B 47/123; G01V 3/26;
(Continued)

(56) References Cited

U.S. PATENT DOCUMENTS 4,120,166 A * 10/1978 Brooks, Jr. ......... E02B 17/0008
166/253.1
4,348,587 A * 9/1982 Tangonan .......... G01R 33/0327
250/227.14

(Continued)

FOREIGN PATENT DOCUMENTS

DE  102011050717 A1 * 12/2012 ............ G01B 11/18
EP  0190859  8/1986
(Continued)

OTHER PUBLICATIONS

International Search Report and Written Opinion of PCT Application No. PCT/US2014/061079 dated Jun. 30, 2015: pp. 1-12.
(Continued)

*Primary Examiner* — Jonathan M Dunlap
(74) *Attorney, Agent, or Firm* — Chamberlain Hrdlicka

(57) ABSTRACT

A method of monitoring a substance in a well can include disposing at least one optical electromagnetic sensor and at least one electromagnetic transmitter in the well, and inducing strain in the sensor, the strain being indicative of an electromagnetic parameter of the substance in an annulus between a casing and a wellbore of the well. A system for monitoring a substance in a well can include at least one electromagnetic transmitter, and at least one optical electromagnetic sensor with an optical waveguide extending along a wellbore to a remote location, the sensor being positioned external to a casing in the wellbore.

17 Claims, 9 Drawing Sheets

(51) Int. Cl.
*G01V 3/30* (2006.01)
*E21B 47/10* (2012.01)
*E21B 47/12* (2012.01)
*G01V 3/26* (2006.01)
*G01V 8/16* (2006.01)
*G01R 27/02* (2006.01)
*G01N 27/72* (2006.01)
*G01N 27/74* (2006.01)
*G01R 27/26* (2006.01)
*G01N 27/76* (2006.01)
*G01N 27/04* (2006.01)
*G01N 27/02* (2006.01)

(52) U.S. Cl.
CPC ............... *G01V 3/18* (2013.01); *G01V 3/26* (2013.01); *G01V 3/30* (2013.01); *G01V 8/16* (2013.01); *G01N 27/02* (2013.01); *G01N 27/04* (2013.01); *G01N 27/041* (2013.01); *G01N 27/72* (2013.01); *G01N 27/74* (2013.01); *G01N 27/76* (2013.01); *G01R 27/02* (2013.01); *G01R 27/2617* (2013.01); *G01R 27/2682* (2013.01)

(58) Field of Classification Search
CPC ... G01V 8/16; G01V 3/00; G01V 3/20; G01V 3/22; G01V 3/24; G01V 3/30; G01V 3/34; G01N 27/00; G01N 27/02; G01N 27/04; G01N 27/041; G01N 27/72; G01N 27/76; G01N 27/74; G01R 27/02; G01R 27/2617; G01R 27/2682; G01D 5/35303; G01D 5/268
USPC ...... 324/244.1, 96, 260, 338, 339, 263, 303, 324/333, 334; 73/152.28
See application file for complete search history.

(56) References Cited

U.S. PATENT DOCUMENTS

| | | | | |
|---|---|---|---|---|
| 4,376,248 A | * | 3/1983 | Giallorenzi | G01R 33/02 250/227.19 |
| 4,378,497 A | * | 3/1983 | Giallorenzi | G01R 33/0327 250/227.19 |
| 4,433,291 A | * | 2/1984 | Yariv | G01R 33/0327 250/227.19 |
| 4,622,460 A | * | 11/1986 | Failes | G01R 33/0327 250/227.19 |
| 4,653,916 A | | 3/1987 | Henning et al. | |
| 4,868,495 A | * | 9/1989 | Einzig | G01R 29/0885 324/244.1 |
| 4,918,371 A | * | 4/1990 | Bobb | G01R 15/248 250/227.19 |
| 4,947,037 A | | 8/1990 | Nash et al. | |
| 5,007,705 A | * | 4/1991 | Morey | G02B 6/022 385/12 |
| 5,171,981 A | * | 12/1992 | Wood | G01R 1/071 250/227.14 |
| 5,305,075 A | * | 4/1994 | Bucholtz | G01R 33/0327 250/227.19 |
| 5,471,139 A | * | 11/1995 | Zadoff | G01B 7/003 250/227.14 |
| 5,491,335 A | * | 2/1996 | Bucholtz | G01D 5/35303 250/227.24 |
| 5,754,284 A | * | 5/1998 | Leblanc | G01M 11/3109 356/73.1 |
| 5,818,585 A | * | 10/1998 | Davis | G01D 5/35383 356/35.5 |
| 5,898,517 A | * | 4/1999 | Weis | E21B 47/123 356/32 |
| 6,137,621 A | * | 10/2000 | Wu | E21B 47/123 181/102 |
| 6,289,740 B1 | * | 9/2001 | Posey, Jr. | G01L 1/246 250/227.18 |
| 6,294,917 B1 | * | 9/2001 | Nichols | G01V 3/28 324/339 |
| 6,314,056 B1 | * | 11/2001 | Bunn | G01H 9/004 367/149 |
| 6,463,186 B1 | * | 10/2002 | Li | G02F 1/0128 356/450 |
| 6,480,000 B1 | * | 11/2002 | Kong | E21B 47/01 166/66 |
| 6,675,895 B1 | * | 1/2004 | Shehab | E21B 33/13 166/250.14 |
| 6,724,469 B2 | * | 4/2004 | Leblanc | G01M 11/3181 356/73.1 |
| 6,747,743 B2 | * | 6/2004 | Skinner | G01D 5/35303 356/477 |
| 6,809,516 B1 | * | 10/2004 | Li | G01R 15/20 324/244 |
| 6,874,361 B1 | | 4/2005 | Meltz et al. | |
| 6,957,576 B2 | * | 10/2005 | Skinner | E21B 47/0006 73/152.51 |
| 7,151,377 B2 | * | 12/2006 | Chouzenoux | E21B 17/003 324/368 |
| 7,154,081 B1 | * | 12/2006 | Friedersdorf | G01B 11/18 250/227.14 |
| 7,256,582 B2 | * | 8/2007 | Gorek | G01V 3/20 324/347 |
| 7,274,441 B2 | | 9/2007 | Payton | |
| 7,453,763 B2 | * | 11/2008 | Johnstad | G01V 1/201 181/111 |
| 7,679,368 B2 | * | 3/2010 | Folberth | G01V 3/24 324/355 |
| 7,764,363 B2 | | 7/2010 | Hayward et al. | |
| 7,885,142 B2 | * | 2/2011 | Tello | G01V 1/44 181/105 |
| 7,900,699 B2 | * | 3/2011 | Ramos | E21B 47/09 166/250.01 |
| 8,035,393 B2 | * | 10/2011 | Tenghamn | G01V 3/083 324/347 |
| 8,162,050 B2 | * | 4/2012 | Roddy | E21B 33/13 166/250.14 |
| 8,172,007 B2 | * | 5/2012 | Dolman | E21B 47/1015 166/250.11 |
| 8,538,701 B2 | * | 9/2013 | Roy | E21B 49/08 324/324 |
| 8,710,852 B2 | * | 4/2014 | Baroud | G01N 33/383 324/663 |
| 8,776,609 B2 | * | 7/2014 | Dria | E21B 47/0005 73/760 |
| 8,800,653 B2 | * | 8/2014 | Dria | E21B 47/065 166/250.06 |
| 9,146,151 B2 | | 9/2015 | Kupershmidt | |
| 9,274,240 B2 | * | 3/2016 | Frisch | E21B 47/0005 |
| 9,739,905 B2 | * | 8/2017 | Sena | G01V 3/28 |
| 2001/0023614 A1 | * | 9/2001 | Tubel | E21B 23/03 73/152.39 |
| 2001/0026156 A1 | * | 10/2001 | Dubourg | G01V 3/20 324/312 |
| 2001/0030539 A1 | * | 10/2001 | Montgomery | G01V 9/02 324/324 |
| 2002/0196993 A1 | * | 12/2002 | Schroeder | G01L 1/246 385/12 |
| 2003/0057950 A1 | * | 3/2003 | Gao | G01V 3/28 324/339 |
| 2003/0127232 A1 | * | 7/2003 | Bussear | E21B 34/14 166/373 |
| 2003/0205375 A1 | * | 11/2003 | Wright | E21B 43/26 166/250.1 |
| 2004/0135075 A1 | * | 7/2004 | Hay | E21B 34/14 250/227.21 |
| 2005/0034863 A1 | * | 2/2005 | Dillenbeck | E21B 33/05 166/285 |
| 2006/0028208 A1 | * | 2/2006 | Strack | G01V 3/24 324/355 |
| 2006/0038115 A1 | * | 2/2006 | Maas | G01H 9/004 250/227.18 |

(56) References Cited

U.S. PATENT DOCUMENTS

| | | | | |
|---|---|---|---|---|
| 2006/0081412 | A1* | 4/2006 | Wright | E21B 43/26 181/104 |
| 2007/0046289 | A1* | 3/2007 | Troxler | G01N 33/42 324/334 |
| 2008/0042636 | A1* | 2/2008 | Koste | G01R 15/205 324/96 |
| 2009/0086575 | A1* | 4/2009 | Tello | E21B 47/0005 367/35 |
| 2009/0199630 | A1* | 8/2009 | DiFoggio | E21B 47/123 73/152.28 |
| 2010/0046002 | A1* | 2/2010 | Perez | G01H 9/00 356/478 |
| 2010/0308832 | A1* | 12/2010 | Clark | G01V 3/28 324/338 |
| 2010/0316328 | A1* | 12/2010 | Arias Vidal | G01D 5/485 385/12 |
| 2011/0046002 | A1* | 2/2011 | Yeatman | C12Q 1/6886 506/9 |
| 2011/0084696 | A1* | 4/2011 | Tenghamn | G01V 3/083 324/337 |
| 2011/0088462 | A1* | 4/2011 | Samson | E21B 47/10 73/152.18 |
| 2011/0090496 | A1* | 4/2011 | Samson | E21B 47/065 356/301 |
| 2011/0139447 | A1* | 6/2011 | Ramos | E21B 47/09 166/254.2 |
| 2011/0170112 | A1* | 7/2011 | Gibler | G01J 3/02 356/480 |
| 2011/0292763 | A1* | 12/2011 | Coates | E21B 47/01 367/25 |
| 2011/0298461 | A1* | 12/2011 | Bittar | G01V 3/28 324/338 |
| 2011/0308788 | A1 | 12/2011 | Ravi et al. | |
| 2012/0001625 | A1* | 1/2012 | Yamada | G01R 33/032 324/244.1 |
| 2012/0013893 | A1* | 1/2012 | Maida | E21B 47/123 356/73.1 |
| 2012/0014211 | A1* | 1/2012 | Maida, Jr. | E21B 47/09 367/13 |
| 2012/0061084 | A1* | 3/2012 | Sweatman | E21B 41/0064 166/305.1 |
| 2012/0126993 | A1* | 5/2012 | Samson | G01V 1/003 340/854.8 |
| 2012/0132007 | A1 | 5/2012 | Dria et al. | |
| 2012/0132417 | A1* | 5/2012 | Dria | E21B 47/0006 166/250.01 |
| 2012/0136577 | A1* | 5/2012 | Dria | E21B 41/02 702/11 |
| 2012/0147381 | A1* | 6/2012 | LeBlanc | E21B 47/123 356/480 |
| 2012/0155508 | A1* | 6/2012 | Dria | E21B 43/164 374/107 |
| 2012/0158333 | A1* | 6/2012 | Li | G01N 27/021 702/65 |
| 2012/0179378 | A1* | 7/2012 | Duncan | E21B 47/0007 702/8 |
| 2012/0205103 | A1 | 8/2012 | Ravi et al. | |
| 2012/0212229 | A1* | 8/2012 | Sinclair | G01V 3/28 324/345 |
| 2012/0234605 | A1* | 9/2012 | Donderici | G01V 1/46 175/73 |
| 2012/0250017 | A1* | 10/2012 | Morys | G01N 21/31 356/335 |
| 2012/0257475 | A1* | 10/2012 | Luscombe | G01V 1/48 367/25 |
| 2013/0113488 | A1* | 5/2013 | Bittar | E21B 25/00 324/333 |
| 2013/0239673 | A1* | 9/2013 | Garcia-Osuna | E21B 17/16 73/152.46 |
| 2013/0333882 | A1* | 12/2013 | Stukan | E21B 43/162 166/252.5 |
| 2014/0132420 | A1* | 5/2014 | Liu | G01V 3/28 340/853.1 |
| 2014/0139225 | A1 | 5/2014 | Mandviwala | |
| 2014/0318783 | A1* | 10/2014 | Martin | E21B 33/14 166/292 |
| 2014/0320126 | A1* | 10/2014 | Heaton | G01V 11/00 324/303 |
| 2014/0338896 | A1* | 11/2014 | McGarian | E21B 47/0005 166/250.08 |
| 2014/0367092 | A1* | 12/2014 | Roberson | E21B 47/00 166/250.01 |
| 2015/0204189 | A1* | 7/2015 | Indo | E21B 47/102 356/440 |
| 2015/0233234 | A1* | 8/2015 | Jannin | E21B 47/102 324/355 |
| 2017/0204719 | A1* | 7/2017 | Babakhani | E21B 47/0005 |
| 2019/0180065 | A1* | 6/2019 | Babakhan | E21B 41/0085 |

FOREIGN PATENT DOCUMENTS

| | | |
|---|---|---|
| WO | 2014077985 | 5/2014 |
| WO | 2014077986 | 5/2014 |
| WO | 2014120305 | 8/2014 |
| WO | 2015130298 | 9/2015 |
| WO | 2015178876 | 11/2015 |
| WO | 2015178878 | 11/2015 |

OTHER PUBLICATIONS

Bush et al., Paper 5589-19: "Low-cost Interferometric TDM technology for dynamic sensing applications," Proceedings of SPIE, Fiber Optic Sensor Technology and Applications III, 2004: 1-12.

Cekorich, "Demodulator for interferometric sensors," SPIE Photonics East, 1999: 1-10.

\* cited by examiner

WELL MONITORING WITH OPTICAL ELECTROMAGNETIC SENSING SYSTEM

TECHNICAL FIELD

This disclosure relates generally to operations performed and equipment utilized in conjunction with a subterranean well and, in one example described below, more particularly provides for well monitoring with an optical electromagnetic sensing system.

BACKGROUND

It can be important to be able to determine whether a substance is present at a particular location in a well, whether a substance is displacing appropriately in the well or whether the substance is changing in the well. For example, in a cementing operation, it would be beneficial to be able to determine whether cement is displacing other fluids in an annulus, whether the cement has filled the annulus, and whether the cement has properly cured. For these reasons and others, it will be appreciated that advancements are continually needed in the art of well monitoring.

DETAILED DESCRIPTION

Figure 1:
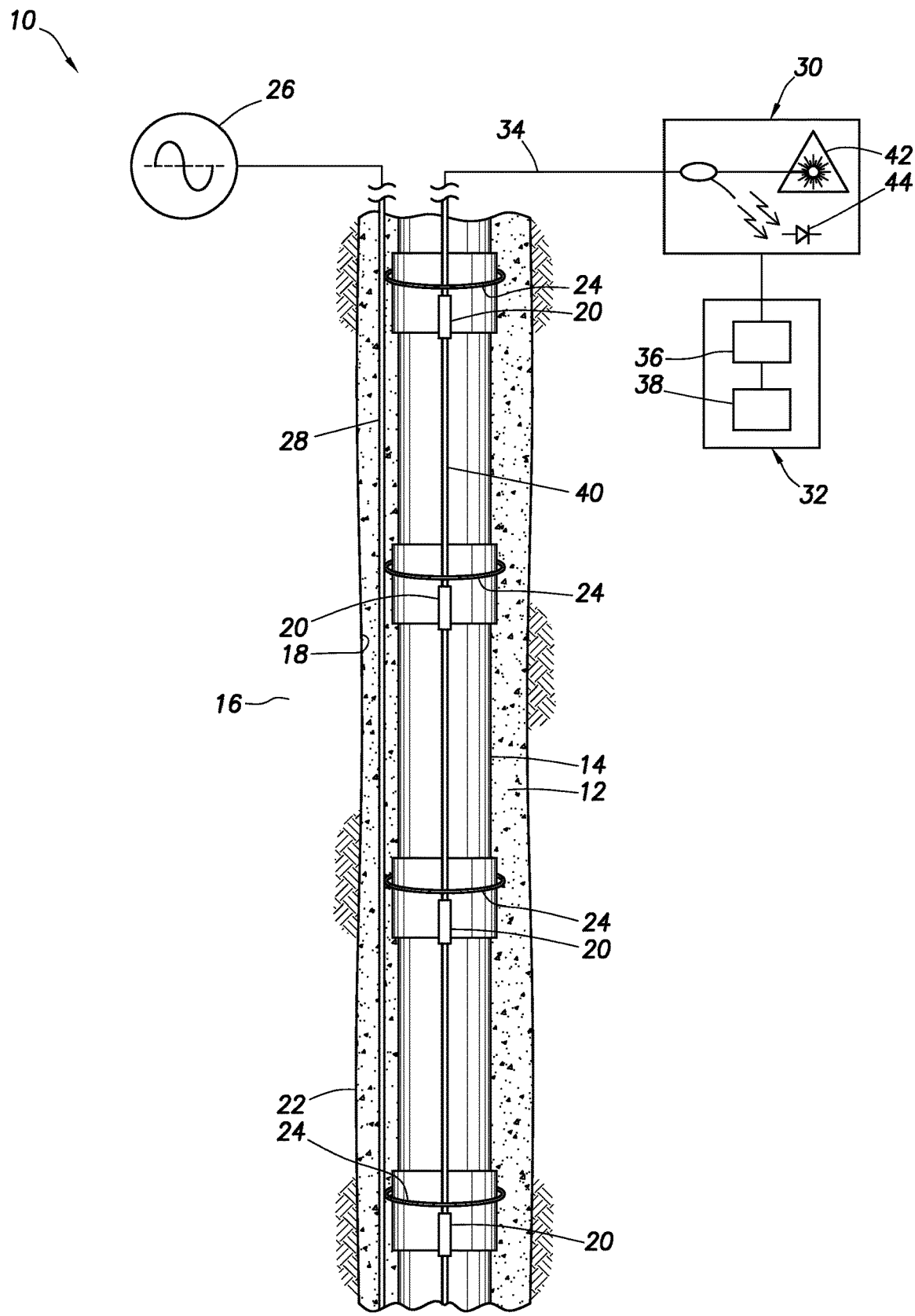
FIG. 1 is a representative partially cross-sectional view of a well monitoring system and associated method which can embody principles of this disclosure.

Representatively illustrated in FIG. 1 is a system 10 for use with a subterranean well, and an associated method, which system and method can embody principles of this disclosure. However, it should be clearly understood that the system 10 and method are merely one example of an application of the principles of this disclosure in practice, and a wide variety of other examples are possible. Therefore, the scope of this disclosure is not limited at all to the details of the system 10 and method described herein and/or depicted in the drawings.

In some examples described below, this disclosure relates to electromagnetic methods for monitoring a cementing operation in a well. More specifically, these examples relate to systems and methods of monitoring cement cure and cement integrity, and identifying fluids in a well annulus.

Recently, optical electromagnetic reservoir monitoring solutions have been proposed (see, for example, International application nos. PCT/US13/64115 filed on 9 Oct. 2013, PCT/US13/64122 filed on 9 Oct. 2013, PCT/US2014/038542 filed on 19 May 2014, PCT/US2014/038552 filed on May 19, 2014, PCT/US13/67288 filed on 29 Oct. 2013 and PCT/US2014/019228 filed on 28 Feb. 2014). These reservoir monitoring solutions include methods of fiber optic electric field, magnetic field and magnetic induction sensing based on fiber optic strain measurements. However, these reservoir monitoring methods are not developed for sensing cement or other substances outside of casing in a well annulus.

In some examples, discrete optical electromagnetic sensors include electrically or magnetically sensitive material bonded to an optical fiber. The optical fiber is remotely interrogated to thereby detect strain, if any, induced in the optical fiber by the electrically or magnetically sensitive material. Techniques well known to those skilled in the art as distributed strain sensing (DSS) can be used to detect strain at locations along the optical fiber.

In the FIG. 1 example, the system 10 provides for measuring and monitoring of fluids in an annulus 12 of a well formed between a casing 14 and an earth formation 16 penetrated by a wellbore 18. Optical electromagnetic sensors are 20 distributed along the casing 14.

In one example, fluids are flowed downwardly through the casing 14, and then upwardly through the annulus 12, during a cementing operation. Oil-based or water-based drilling fluid is initially in place in the annulus 12 between the casing 14 and the formation 16. A spacer fluid, and then cement 22 (typically as a slurry), are subsequently pumped through the casing 14 and into the annulus 12.

The cement 22 slurry displaces the spacer fluid, which in turn displaces the drilling fluid. The cement 22 is allowed to set in the annulus 12, thereby sealing off the annulus and securing the casing 14 in the wellbore 18.

As used herein, the term "casing" is used to indicate a protective wellbore lining. Casing can be in forms known to those skilled in the art as casing, liner or tubing. Casing can be made of metals or non-metals. Casing can be segmented or continuous. Casing can be pre-formed or formed in situ. Thus, the scope of this disclosure is not limited to use of any particular type of casing.

As used herein, the term "cement" is used to indicate a material that hardens, cures or "sets" in a well to thereby seal off a space. Cement can be used to seal off an annulus between a casing and a wellbore, or can be used to seal off an annulus between two tubulars. Cement can be used to seal off a passage in a tubular. Cement is not necessarily cementitious, since cements can be made up of polymers (such as epoxies, etc.) and/or other materials, which can harden due to passage of time, exposure to elevated temperature, exposure to other substances, etc. Thus, the scope of this disclosure is not limited to use of any particular type of cement.

Contamination of the cement 22 with the drilling fluid or spacer fluid can have significant negative consequences for curing and integrity of the cement, and can provide potential conduits for future flow behind casing. Thus, the cement's structural integrity and sealing ability can be affected by the presence of other fluids in the annulus 12 while the cement is hardening therein.

As described more fully below, the system 10 and method implement an array of electromagnetic transmitters 24 and optical electromagnetic sensors 20 configured for time-lapse measurements to characterize fluids in the annulus 12. The fluid in the annulus 12 (such as, drilling fluid, cement, spacer, combinations thereof, etc.) is characterized and identified based on its resistivity.

Shallow resistivity measurement in the annulus 12 is used for characterizing the fluid therein. In addition, as the cement 22 cure progresses, the resistivity will vary over time until the cement is fully cured.

This change in resistivity can be monitored using time-lapse electromagnetic measurements, wherein electric or magnetic field is measured using discrete optical electric or magnetic field sensors 20. The electric or magnetic field measurements are converted to resistivity through inversion algorithms. The resistivity values over time can be correlated to curing properties of cement 22.

The time lapse measurement of resistivity can be accomplished either by electric field sensing and/or magnetic field sensing. For magnetic field sensing, the transmitters 24 can comprise an array of coils mounted on steel casing 14, and connected in series. An electrical power supply 26 can be connected to each of the transmitters 24 with an electrical cable 28.

Another line or cable 40 may extend through the wellbore 18. The cable 40 may be attached external to the casing 14, positioned in a wall of the casing, or otherwise positioned. The cables 28, 40 may be combined into a single cable.

The cable 40 includes therein at least one optical waveguide 34 (such as, an optical fiber or an optical ribbon), and may include other lines (such as, electrical and/or hydraulic lines), strength members, etc. The cable 40 may, in some examples, be in the form of the optical waveguide 34 enclosed by armor or another protective covering (such as, a metal tube).

Whether or not the optical waveguide 34 is part of a cable, the optical waveguide could be internal or external to, or positioned in a wall of, any tubular string (such as, the casing 14). The scope of this disclosure is not limited to any particular form, configuration or position of the optical waveguide 34 in a well.

In the FIG. 1 example, the optical waveguide 34 is optically connected to an optical interrogator 30. The optical interrogator 30 is depicted schematically in FIG. 1 as including an optical source 42 (such as, a laser or a light emitting diode) and an optical detector 44 (such as, an opto-electric converter or photodiode).

The optical source 42 launches light (electromagnetic energy) into the waveguide 34, and light returned to the interrogator 30 is detected by the detector 44. Note that it is not necessary for the light to be launched into a same end of the optical waveguide 34 as an end via which light is returned to the interrogator 30.

Other or different equipment (such as, an interferometer or an optical time domain or frequency domain reflectometer) may be included in the interrogator 30 in some examples. The scope of this disclosure is not limited to use of any particular type or construction of optical interrogator.

A computer 32 is used to control operation of the interrogator 30, and to record optical measurements made by the interrogator. In this example, the computer 32 includes at least a processor 36 and memory 38. The processor 36 operates the optical source 42, receives measurement data from the detector 44 and manipulates that data. The memory 38 stores instructions for operation of the processor 36, and stores processed measurement data.

The processor 36 and memory 38 can perform additional or different functions in keeping with the scope of this disclosure. For example, the computer 32 could be used to control operation of the electrical power supply 26, if desired.

In other examples, different types of computers may be used, the computer 32 could include other equipment (such as, input and output devices, etc.). The computer 32 could be integrated with the interrogator 30 and/or power supply 26 into a single instrument. Thus, the scope of this disclosure is not limited to use of any particular type or construction of computer.

The optical waveguide 34, interrogator 30 and computer 32 may comprise a distributed strain sensing (DSS) system capable of detecting strain energy as distributed along the optical waveguide. For example, the interrogator 30 can be used to measure Brillouin or coherent Rayleigh scattering in the optical waveguide 34 as an indication of strain energy as distributed along the waveguide.

In addition, a ratio of Stokes and anti-Stokes components of Raman scattering in the optical waveguide 34 could be monitored as an indication of temperature as distributed along the waveguide. In other examples, Brillouin scattering may be detected as an indication of temperature as distributed along the optical waveguide 34.

In further examples, fiber Bragg gratings (not shown) could be closely spaced apart along the optical waveguide 34, so that strain in the waveguide will result in changes in light reflected back to the interrogator 30. An interferometer (not shown) may be used to detect such changes in the reflected light.

Figure 2:
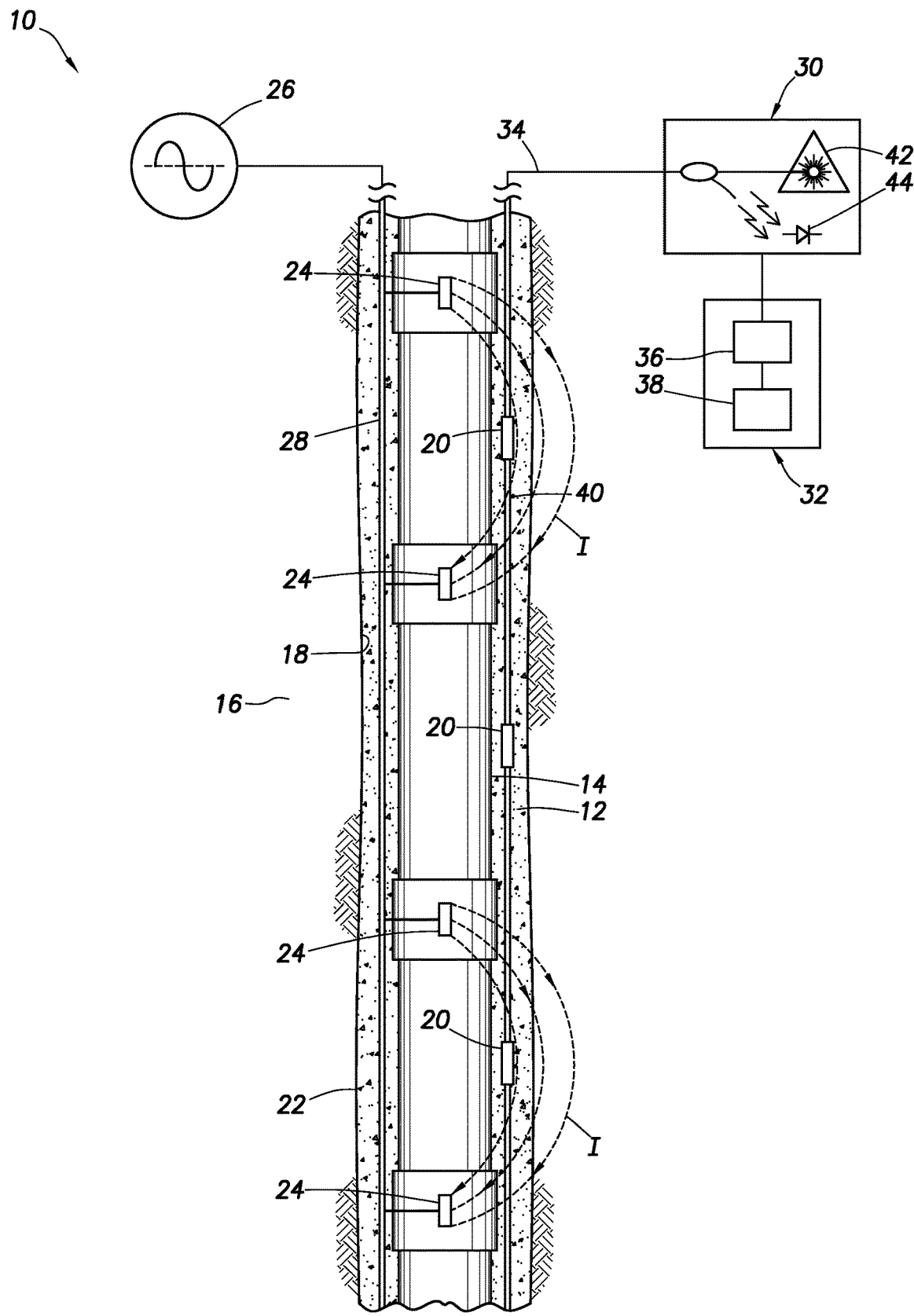
FIG. 2 is a representative partially cross-sectional view of another example of the system and method.

Referring additionally now to FIG. 2, another example of the system 10 is representatively illustrated. In this example, the transmitters 24 comprise pairs of electrodes (dipole or bipoles) mounted on the casing 14.

An electrical current I is injected into the cement 22/formation 16 via the electrodes of the transmitters 24. In this example, one pair of electrodes is activated at a time, and data from the sensors 20 is collected for each pair of electrodes activated.

Figure 3:
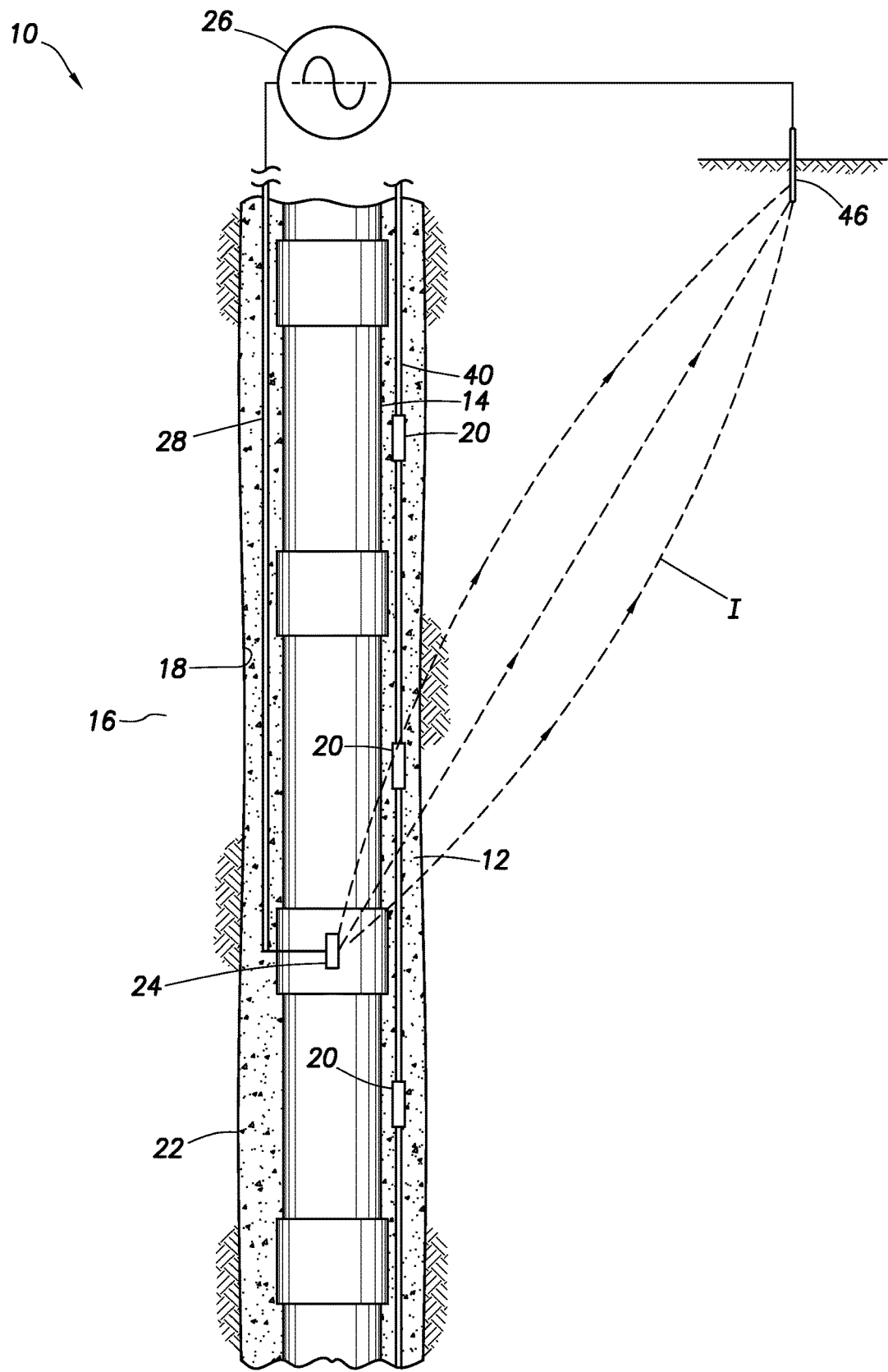
FIG. 3 is a representative partially cross-sectional view of another example of the system and method.

Referring additionally now to FIG. 3, another example of the system 10 is representatively illustrated. In this example, the current I can be injected in the cement 22/formation 16 through a monopole, where the current is injected to one electrode located downhole, with another electrode (counter electrode) 46 being located at a relatively distant location. Note that the interrogator 30 and computer 32 are not depicted in FIG. 3 for clarity of illustration.

Figure 4:
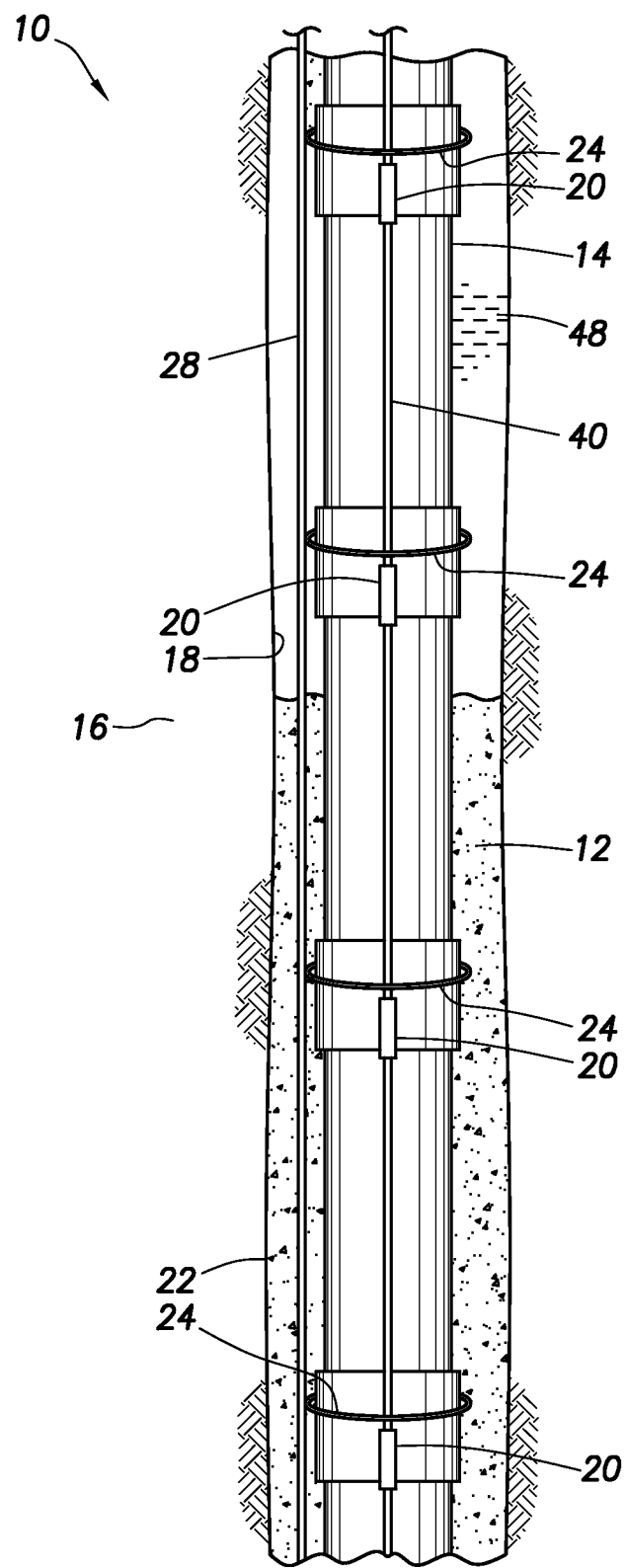
FIG. 4 is a representative partially cross-sectional view of another example of the system and method.

Referring additionally now to FIG. 4, another example of the system 10 is representatively illustrated. In this example, another fluid 48 (such as, a spacer fluid, drilling fluid, etc.) is present in the annulus 12.

Differences in electrical properties as detected by the sensors 20 can be used to sense differences in fluid types. For example, spacer fluids, water based drilling muds and oil based drilling muds, have dielectric properties different from each other and from cement 22.

In this manner, prior to placement of the cement 22, success of a spacer flush of drilling muds from the annulus 12 can be determined. That is, a complete flush of drilling fluid from the annulus 12 will be indicated by a corresponding change in dielectric properties along the annulus, as detected by the sensors 20.

Figure 5:
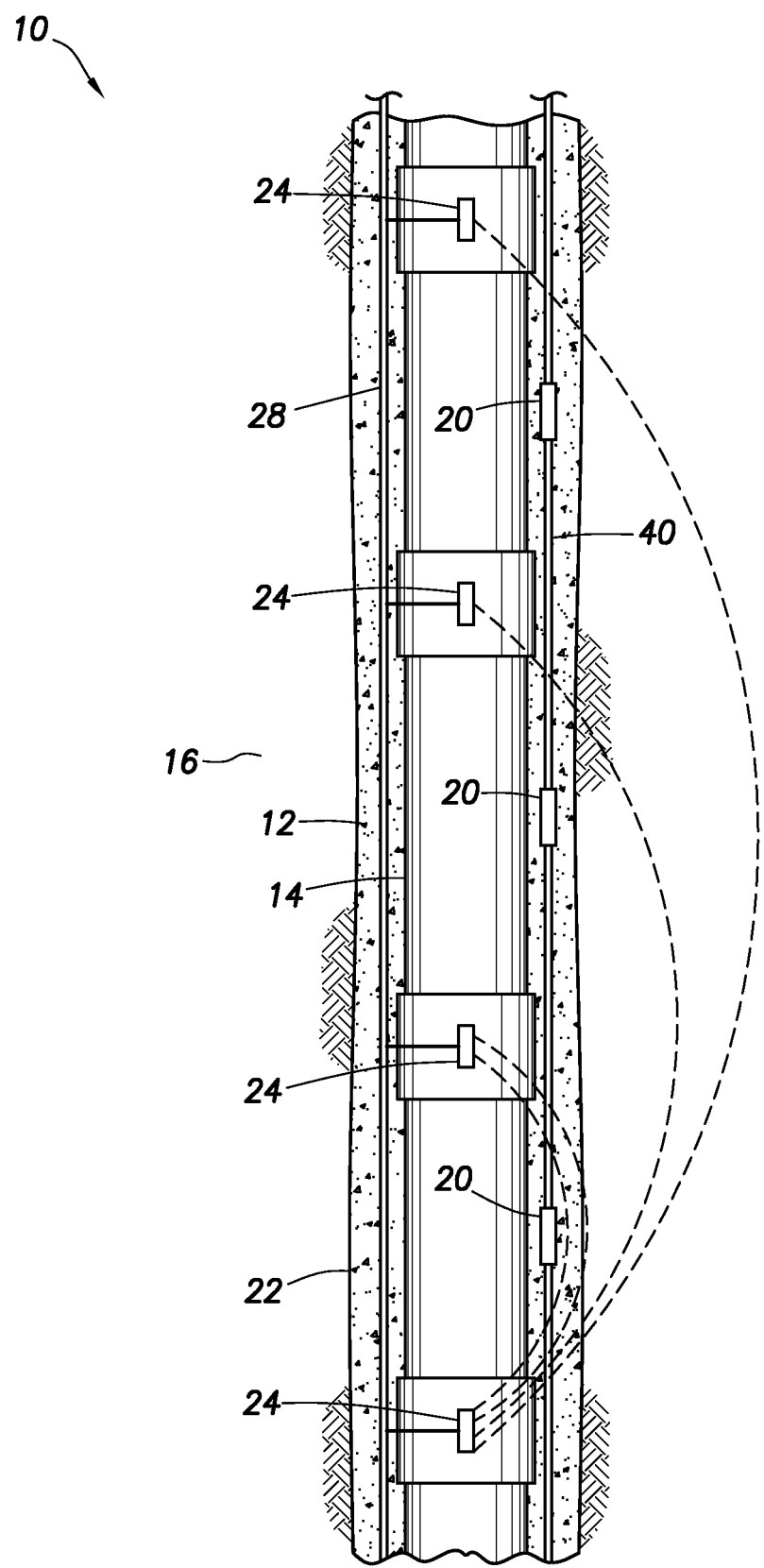
FIG. 5 is a representative partially cross-sectional view of another example of the system and method.

In the FIG. 4 example, the transmitters 24 comprise coils. In another example representatively illustrated in FIG. 5, the transmitters 24 can comprise multiple electrodes to obtain dielectric properties information at different depths in the wellbore 18.

Greater electrode spacing may allow for resulting electrical fields lines to penetrate deeper into the formation 16.

This may provide valuable information about the formation 16 and an interface between the cement 22 and the formation.

In the FIGS. 1-5 examples, shallow depth of detection is used for monitoring annulus fluids 48/cement 22. For this reason, an operating frequency of the system 10 is on the order of MHz or GHz for the sensors 20 to "see" a signal from fluid in the annulus 12—at lower frequencies (e.g., less than 10 kHz) a sensor 20 may only see a direct signal from the transmitter 24.

Figure 6:
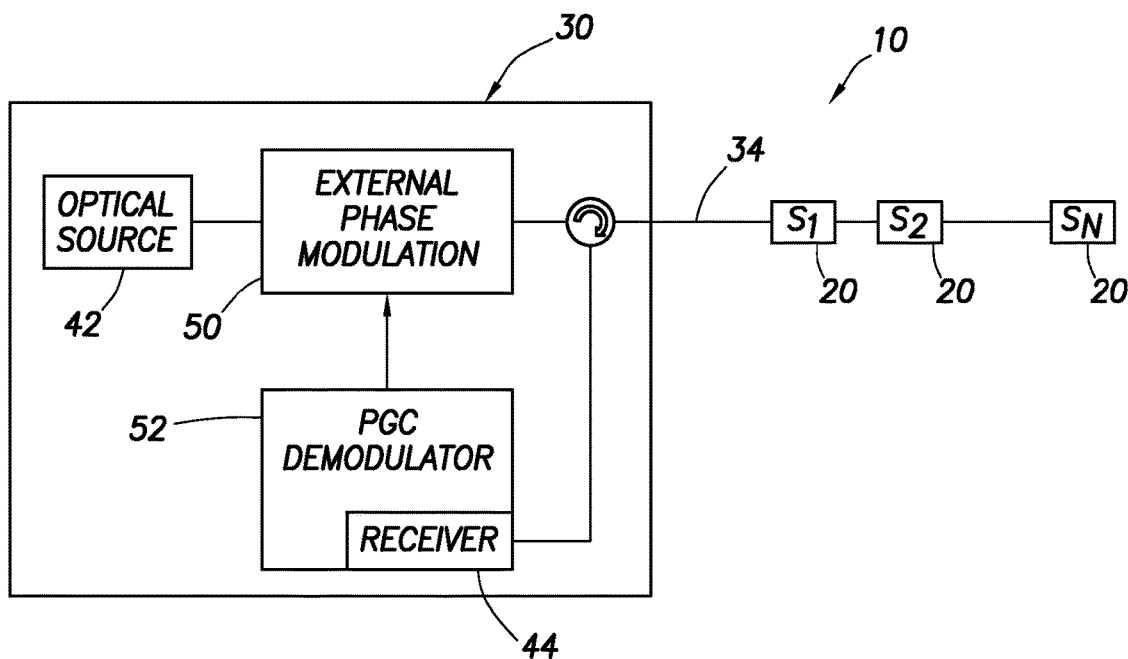
FIG. 6 is a representative schematic view of an optical interrogation technique that may be used with the system and method.

A variety of interrogation methods may be used to enable high frequency (MHz/GHz) demodulation:

1. Wavelength Division Multiplexing—Orthogonal Phase Demodulator (OPD):

A block diagram of the system 10 using OPD demodulation is representatively illustrated in FIG. 6. In this example, the interrogator 30 employs a high coherence optical source 42 (e.g., A. Cekorich, "Demodulator for interferometric sensors," SPIE Photonics East, Boston, USA 1999), and strain is not imparted to the optical waveguide 34 in the sensors 20.

A high frequency external phase modulator 50 (such as, a $LiNbO_3$ phase modulator) is used to modulate a wavelength of light output from the source 42. This modulated light is transmitted through the waveguide 34 to the downhole sensors 20. Each sensor 20 reflects a portion of the light back to the interrogator 30.

The light reflected back from the sensors 20 is received at the (relatively high speed) optical detector 44 of a phase generated carrier (PGC) demodulator 52 of the type well known to those skilled in the art. The PGC demodulation can yield the phase modulation signal of interest in the MHz or GHz range. A high speed A/D convertor (not shown) can be used to obtain the digital data.

Figure 7:
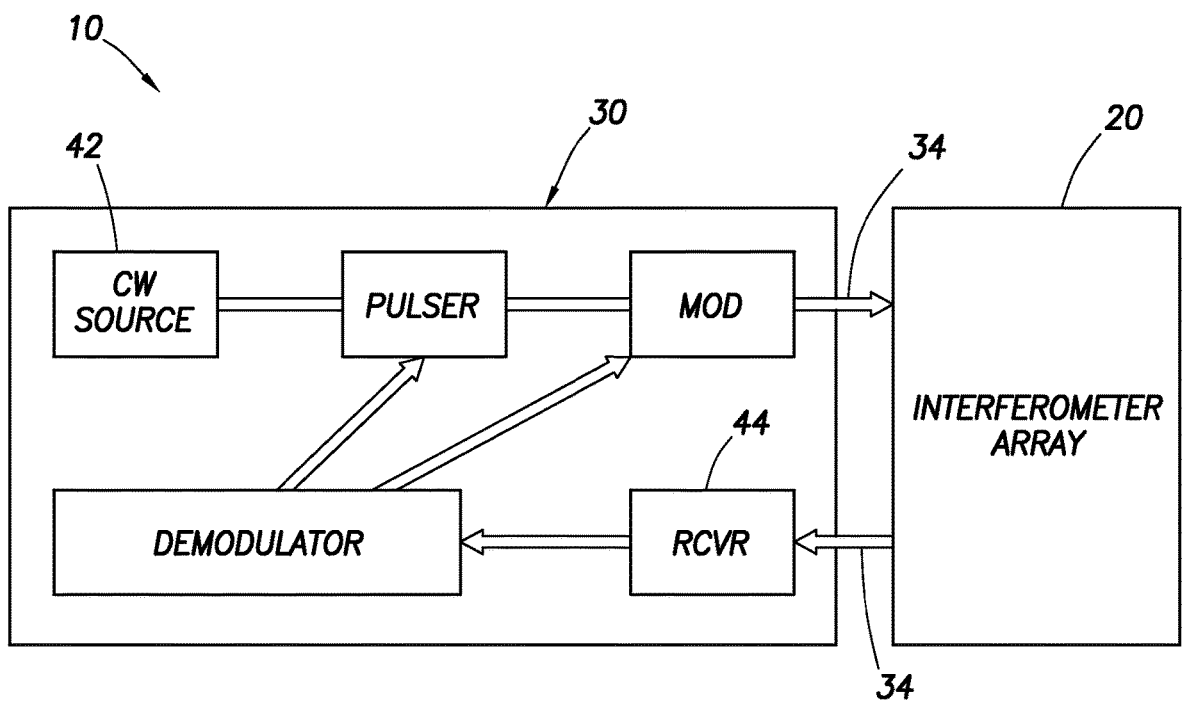
FIG. 7 is a representative schematic view of another interrogation technique example.

2. Time Division Multiplexing (TDM) Interrogation:

The sensors 20 can be multiplexed using time division multiplexing as in an example representatively illustrated in FIG. 7 (see also, e.g., Jeff Bush et al., "Low cost interferometric TDM technology for dynamic sensing application," SPIE Photonics East, 2004).

In this example, a pulsed optical source 42 is used. A pulse width of 100 ns may be used, providing a capability of demodulating signals modulated at ~10 MHz. Further reducing the pulse width to 5 ns can increase the modulation frequency to GHz range, although a compromise in signal to noise ratio may be expected. However, a required sensitivity of the sensors 20 for the system 10 may be moderate, in which case an increase in noise floor due to further narrowing of pulse width can be acceptable.

Figure 8:
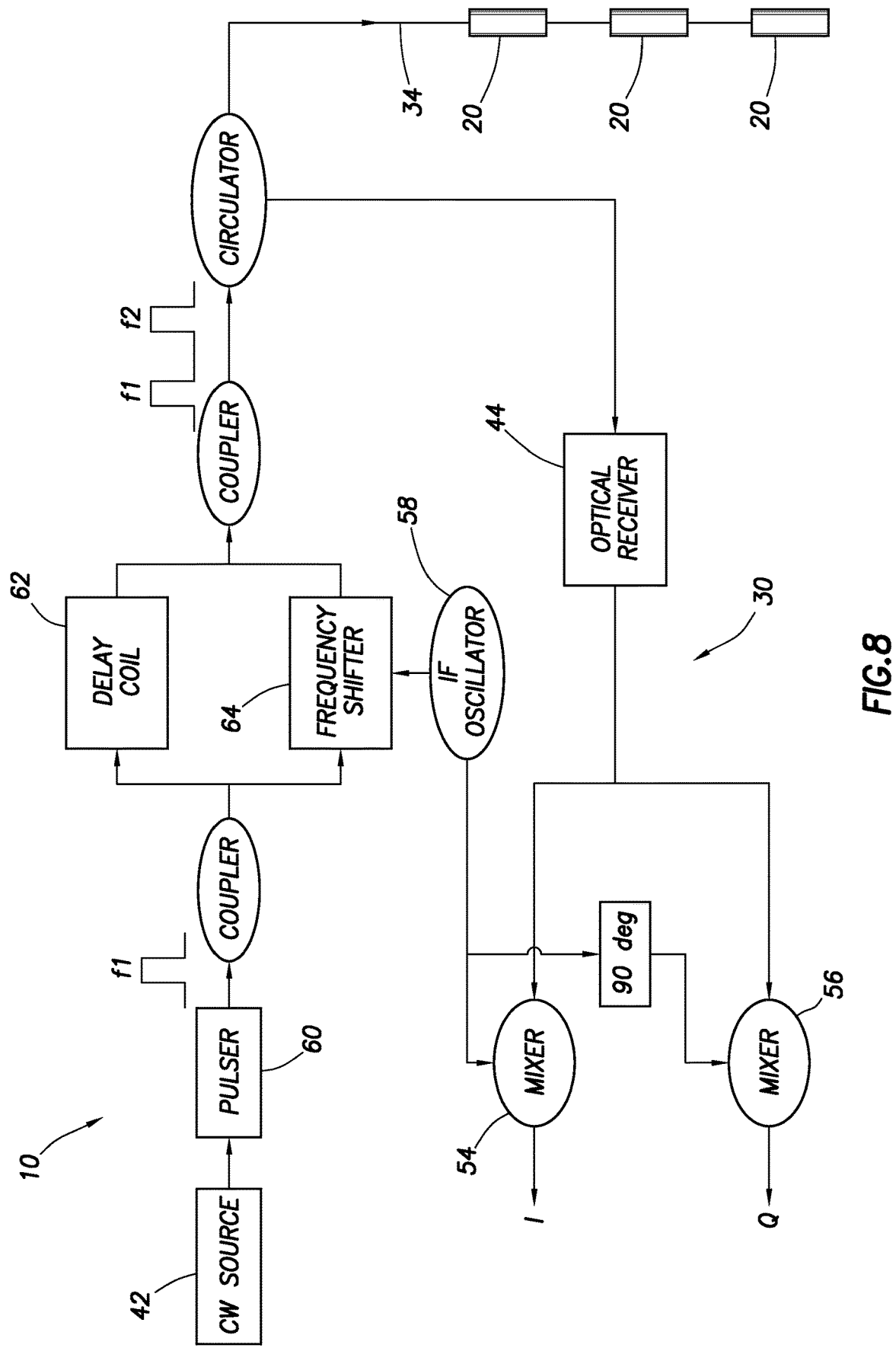
FIG. 8 is a representative schematic view of another interrogation technique example.

3. Heterodyne Method:

Referring additionally now to FIG. 8, an example of a heterodyne interrogation scheme for the system 10 is representatively illustrated. With heterodyne interrogation, a sensor 20 comprising a pair of reflectors with a waveguide between the reflectors that undergoes a strain based on the parameter being measured is interrogated with two pulses f1, f2. The two pulses f1, f2 are spaced at twice the distance between the two reflectors, such that the reflection of the two pulses will arrive back at the interrogator 30 at the same time.

In this example, to determine the phase measurement, the pulses f1, f2 will be shifted in frequency relative to each other by a frequency known as the intermediate frequency (IF). This intermediate frequency will be extracted at the optical receiver/detector 44 of the interrogator 30 from a square-law mixing of the two reflected pulses f1, f2 which overlap.

Phase measurement is made using the intermediate frequency or beat frequency. The IF signal is shifted down to baseband by a pair of mixers 54, 56, which mix the signal from the optical detector 44 with an oscillator 58 generated sinusoid at the same IF.

One mixer 54 receives the oscillator 58 signal directly and the second mixer 56 receives a 90 degree shifted version of the oscillator signal. By doing this, the output of one mixer 54 contains the in-phase (I) measurement of the phase and the second mixer 56 contains the quadrature (Q) measurement of the phase.

These I and Q signals are sampled simultaneously by two analog to digital converters (not shown). Phase can be calculated from the inverse tangent of Q/I. The mixing operations can also be performed digitally if the signal is sampled at a sufficiently high rate.

For providing the two pulses f1, f2, a single pulse generated by a pulse generator 60 may be split into two paths with one path having a delay coil 62 to provide the pulse separation. Additionally, one of the paths may contain a frequency shifting device 64 (for example, an acousto-optic modulator) that will shift the light frequency by the intermediate frequency. A suitable implementation of heterodyne interrogation is described in U.S. Pat. No. 4,653,916.

4. Homodyne Method

Figure 9:
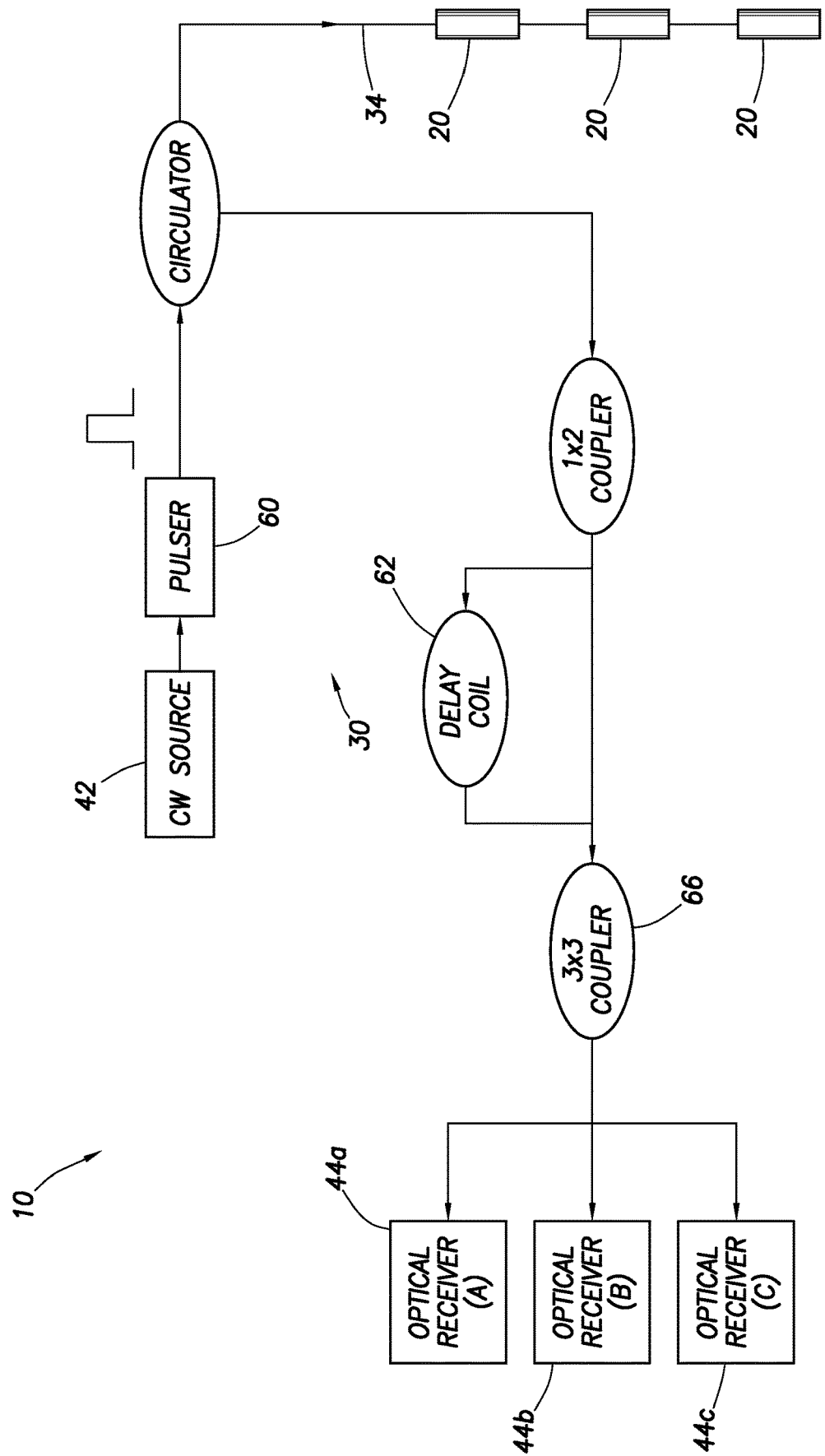
FIG. 9 is a representative schematic view of another interrogation technique example.

Referring additionally now to FIG. 9, an example of a heterodyne interrogation scheme for the system 10 is representatively illustrated. In the homodyne method, a single optical interrogation pulse is sent to the sensors 20.

Each sensor 20 comprises a pair of reflectors, with a waveguide between the reflectors. The waveguide undergoes a strain based on the parameter being measured.

The homodyne interrogation pulse is reflected by both reflectors, which are separated by a certain distance D. As the two pulses pass to the receiver/detector 44a-c section of the interrogator 30, they are split into two paths.

In one path, a delay fiber coil 62 of length equal to 2*D delays the pulse from the first reflector so that, as the two pulses recombine at a 3×3 coupler 66 they are fully overlapping. The two overlapping pulses leave the 3×3 coupler 66 on the three legs of the coupler.

The phases of the pulses in the three legs relative to each other is shifted differently for each leg of the coupler 66 based on coupled mode theory. In this manner, the balanced 3×3 coupler 66 will provide three interferometric signals.

For example, the first leg will contain the combined signals from the reflectors. The second leg will contain the combined signals shifted by +120 degrees. The third leg will contain the combined signals shifted by −120 degrees.

The three legs of the coupler 66 effectively receive phase delays (in addition to the actual phase delay between the light reflected from each of the reflectors of the sensor 20) of 0, +120, and −120 degrees. These three interferometric signals provide enough phase diversity to calculate the phase difference between the light reflected from each of the reflectors of the sensor 20 as follows:

$$I = \operatorname{Sqrt}(3) * (A - B) \tag{1}$$

$$Q = A + B - 2 * C \tag{2}$$

$$\text{Phase} = \arctan(Q/I) \tag{3}$$

wherein A, B and C are the signals received from the three legs of the coupler 66, respectively.

Figure 10:
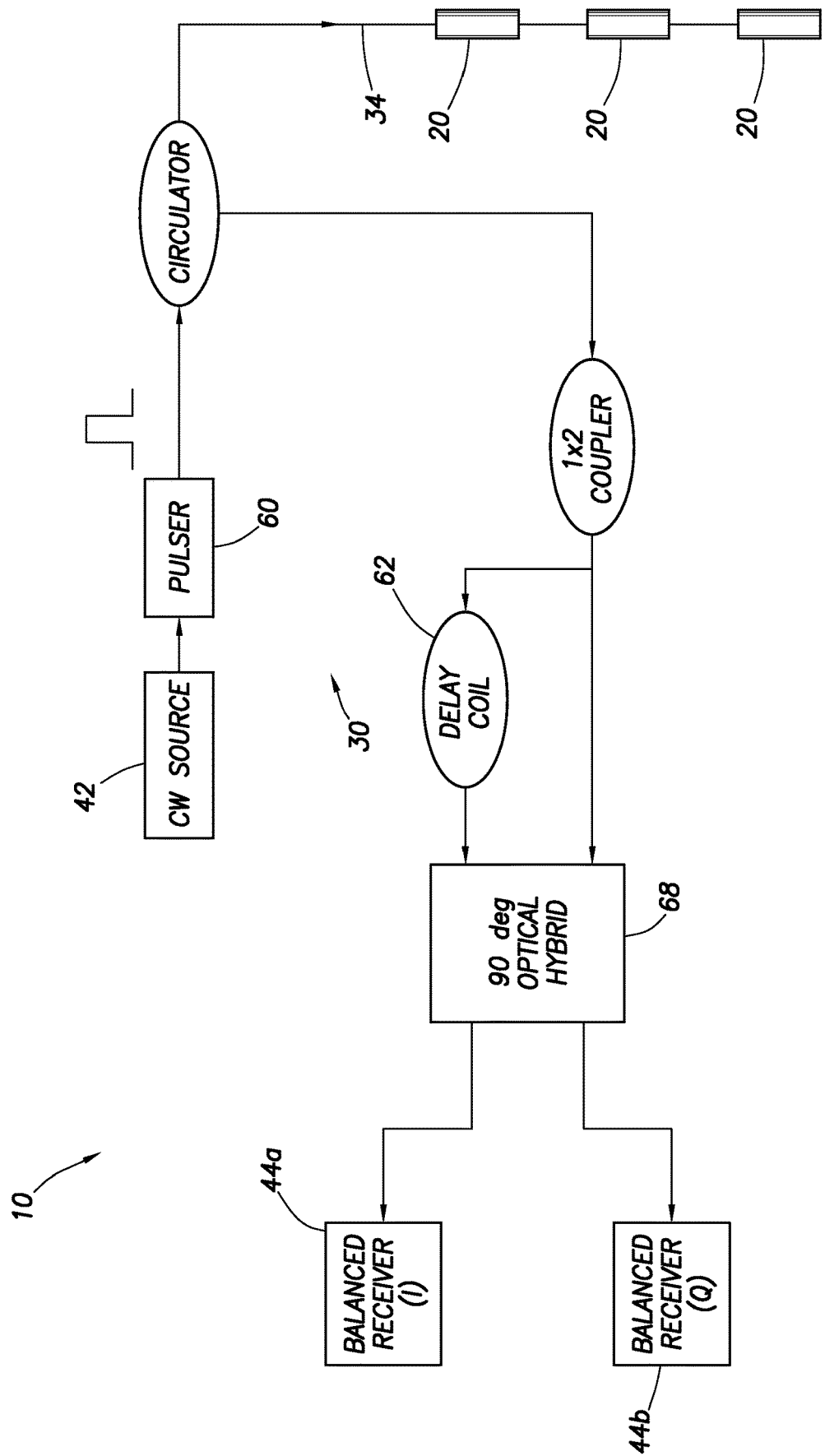
FIG. 10 is a representative schematic view of another interrogation technique example.

Referring additionally now to FIG. 10, another example is representatively illustrated. In this example, the 3×3 coupler 66 is replaced with a 90 degree optical hybrid 68. The optical hybrid 68 is a bulk optical device containing beam splitters and phase delays such that two outputs containing A+B and A+B(+90 degrees) are output.

In addition, the two signals A+B(180 degrees) and A+B (−90 degrees) may also be output. These signals may be sent to balanced receivers 44a,b, where A+B and A+B(180 degrees) are sent to the first balanced receiver 44a and A+B(+90) and A+B(−90) are sent to the second balanced receiver 44b. These two receivers 44a,b will output the I and Q signals used to calculate the phase.

The use of balanced receivers 44a,b also provides for removing a DC offset signal comprising non-interfering components of light that do not provide useful phase information. Suitable 90 degree optical hybrids for use in the interrogator 30 are commercially available from Optoplex Corporation of Fremont, Calif. USA, and balanced receivers are available from ThorLabs, Inc. of Newton, N.J. USA.

Of course, many other examples can be envisioned. In one such example (a homodyne or heterodyne implementation), a single pulse or other modulated interrogation signal is sent from the interrogator 30 to the sensors 20. Returned light is mixed with a continuous wave (CW) source 42 output that was used to generate the original interrogation signal. The mixing may be performed using a 3×3 coupler or 90 degree optical hybrid in the case of homodyne demodulation, or a 2×2 coupler in the case of a heterodyne system where the interrogation signal has been shifted in frequency by an intermediate frequency.

Phase demodulation in either case can be performed in generally the same way as described above, except that the phase difference measurement is for the phase of the reflected light relative to the source 42 output phase (also known to those skilled in the art as a local oscillator) instead of the phase difference between the light from the reflectors of the sensor 20. In this case, the phase from each reflector is separately demodulated and subtracted, in order to obtain the phase difference. An example of this technique is described in U.S. Pat. No. 7,274,441.

In the above heterodyne and homodyne methods, the interrogation rate is limited by a distance between the first and the last sensors 20 in the array. A maximum sample rate is typically based on the following equation:

$$\text{Sample rate} = 1/(\text{Distance} * 10 \text{ ns}) \quad (4)$$

wherein the Distance term is expressed in meters.

For example, if the distance between the first and last sensors 20 is 1 Km, the maximum usable sample rate to avoid interference is 1/(1000 m*10 ns)=100 kHz. To achieve higher sample rates, the sensor 20 array may be separated into regions by using wavelength selective reflectors.

For example, in the above case the sensor 20 array may be divided into four regions, wherein region one uses reflectors responding to wavelength W1, and the other three sections use reflectors responding to wavelengths W2, W3 and W4, respectively. By using four optical sources 42 corresponding to W1, W2, W3 and W4, the sensors 20 may be interrogated at 400 kHz instead of 100 kHz.

It is possible to increase the sample rate beyond these limits by also using pulse timing methods that take advantage of dead periods in the reflected light due to spaces between sensors 20. Suitable methods are described in U.S. Pat. No. 4,947,037. Other methods for higher frequency interrogation are described in US publication no. 2012/0297883.

It may now be fully appreciated that the above disclosure provides significant advancements to the art of monitoring substances in a well annulus. In some examples described above, optical electromagnetic sensors 20 are capable of conveniently monitoring parameters related to substances (such as fluid 48 and cement 22) in the annulus 12, without obstructing an interior of the casing 14, and without the casing interfering with measurements.

The above disclosure also provides for evaluation in real-time of the cement 22 curing process at many locations along the annulus 12. Long-term monitoring of cement 22 integrity is possible without the sensors 20 obstructing the interior of the casing 14. The techniques described above can be extended (for example, via inversion) to give information about the dielectric properties of the formation 16, an interface of the cement 22 with the formation, and/or an interface between different fluids in the annulus 12.

The above disclosure provides to the art a method of monitoring a substance (such as, the cement 22 and/or the fluid 48) in a well. In one example, the method comprises disposing at least one optical electromagnetic sensor 20 and at least one electromagnetic transmitter 24 in the well, and inducing strain in the sensor 20. The strain is indicative of an electromagnetic parameter (such as, resistivity or a dielectric property) of the substance 22, 48 in an annulus 12 between a casing 14 and a wellbore 18 of the well.

The disposing step may be performed without obstructing an interior of the casing 14. The disposing step can comprise positioning the sensor 20 and the transmitter 24 external to the casing 14.

The method may include the transmitter 24 inducing an electrical current and/or a magnetic field in the substance 22, 48.

The inducing step can include inducing strain in an optical waveguide 34 of the sensor 20. The method may include interrogating the optical waveguide 34 from a remote location (such as, at a surface of the earth, a water-based rig, a subsea location, etc.).

The disposing step can include distributing a plurality of the sensors 20 along the annulus 12.

The substance may comprise a cement 22. The strain in the sensor 20 can change as the cement 22 cures, and/or as the cement displaces in the annulus 12.

The above disclosure also provides to the art a system 10 for monitoring a substance (such as, the cement 22 and/or the fluid 48) in a well. In one example, the system 10 comprises at least one electromagnetic transmitter 24, and at least one optical electromagnetic sensor 20 with an optical waveguide 34 extending along a wellbore 18 to a remote location. The sensor 20 is positioned external to a casing 14 in the wellbore 18.

The transmitter 24 may also be positioned external to the casing 14.

The sensor 20 can experience a strain indicative of an electromagnetic parameter of the substance 22, 48. The substance 22, 48 may be disposed in an annulus 12 between the casing 14 and the wellbore 18.

The strain may be induced in the optical waveguide 34.

The transmitter 24 may induce an electrical current and/or a magnetic field in the substance 22, 48.

The "at least one" optical electromagnetic sensor 20 can comprise multiple optical electromagnetic sensors 20 distributed along the casing 14. A strain in the sensor 20 may changes as the cement 22 cures, and/or as the cement displaces in the well.

Although various examples have been described above, with each example having certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Although each example described above includes a certain combination of features, it should be understood that it is not necessary for all features of an example to be used. Instead, any of the features described above can be used, without any other particular feature or features also being used.

It should be understood that the various embodiments described herein may be utilized in various orientations, such as inclined, inverted, horizontal, vertical, etc., and in various configurations, without departing from the principles of this disclosure. The embodiments are described merely as examples of useful applications of the principles of the disclosure, which is not limited to any specific details of these embodiments.

The terms "including," "includes," "comprising," "comprises," and similar terms are used in a non-limiting sense in this specification. For example, if a system, method, apparatus, device, etc., is described as "including" a certain feature or element, the system, method, apparatus, device, etc., can include that feature or element, and can also include other features or elements. Similarly, the term "comprises" is considered to mean "comprises, but is not limited to."

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. For example, structures disclosed as being separately formed can, in other examples, be integrally formed and vice versa. Accordingly, the foregoing detailed description is to be clearly understood as being given by way of illustration and example only, the spirit and scope of the invention being limited solely by the appended claims and their equivalents.

What is claimed is:

1. A method of monitoring a substance or substances in an annulus of a wellbore between a casing in the wellbore and a wellbore wall, the method comprising:
    disposing optical electromagnetic sensors, positioned along a waveguide, and electromagnetic transmitters in the wellbore;
    transmitting electromagnetic signals via the transmitters at a frequency to induce either or both an electrical current or a magnetic field in the substances in the annulus;
    measuring, at the sensors, a first strain in the sensors induced by the electromagnetic signals transmitted through the substances in the annulus and indicative of an electromagnetic parameter of the substances in the annulus;
    identifying the substance in the annulus at each of the sensors by determining the resistivity of the substance at each sensor based on the measured first strain; and
    measuring a second strain in at least some of the sensors induced by the electromagnetic signals transmitted through the substances in the annulus and indicative of the curing of one of the substances in the annulus to monitor the curing of the substance.

2. The method of claim 1, wherein the disposing is performed without obstructing an interior of the casing.

3. The method of claim 1, wherein the disposing further comprises positioning the sensors and the transmitters external to the casing.

4. The method of claim 1, further comprising inducing an electrical current in the substance using the transmitters.

5. The method of claim 1, further comprising inducing a magnetic field in the substance using the transmitters.

6. The method of claim 5, further comprising interrogating the optical waveguide from a remote location.

7. The method of claim 1, wherein measuring the first and second strains further comprises inducing strain in the optical waveguide.

8. The method of claim 1, wherein one of the substances comprises a cement, and wherein the second strain changes as the cement cures.

9. The method of claim 1, wherein one of the substances comprises a cement, and wherein the first strain changes as the cement displaces in the annulus.

10. A system for monitoring a substance or substances in an annulus of a wellbore between a casing when located in the wellbore and a wellbore wall, the system comprising:
    electromagnetic transmitters operable to transmit electromagnetic signals at a frequency to induce either or both an electrical current or a magnetic field in the substances in the annulus;
    optical electromagnetic sensors positioned along an optical waveguide extendable along the wellbore to a remote location, wherein the sensors are positionable external to the casing in the wellbore, and wherein the sensors are operable to measure a first strain induced in response to receiving the electromagnetic signals through the substances in the annulus; and
    an interrogator optically coupled to the waveguide and configured to measure an electromagnetic parameter of the substance at the sensors based at least in part on the first strain and to measure a second strain in at least some of the sensors induced in response to receiving the electromagnetic signals through the substances in the annulus caused by curing of the substance.

11. The system of claim 10, wherein the transmitters are positioned external to the casing.

12. The system of claim 10, wherein the substance is disposed in an annulus between the casing and a wellbore wall of the wellbore.

13. The system of claim 10, wherein the transmitters are operable to induce an electrical current in the substance.

14. The system of claim 10, wherein the transmitters are operable to induce a magnetic field in the substance.

15. The system of claim 10, wherein the first and second strains are induced in the optical waveguide.

16. The system of claim 10, wherein one of the substances comprises a cement, and wherein the second strain changes as the cement cures.

17. The system of claim 10, wherein the substance comprises a cement, and wherein the first strain changes as the cement displaces in the well.

* * * * *